United States Patent
Marupaduga et al.

(10) Patent No.: US 11,240,748 B1
(45) Date of Patent: Feb. 1, 2022

(54) MULTI-FREQUENCY DATA COMMUNICATION SERVICE OVER MULTIPLE WIRELESS ACCESS NODES

(71) Applicant: T-MOBILE INNOVATIONS LLC, Overland Park, KS (US)

(72) Inventors: Sreekar Marupaduga, Overland Park, KS (US); Rajveen Narendran, Olathe, KS (US); Ajay Dahyabhai Patel, Frederick, MD (US); Anurag Thantharate, Kansas City, MO (US)

(73) Assignee: Sprint Communications Company L.P., Overland Park, KS (US)

( * ) Notice: Subject to any disclaimer, the term of this patent is extended or adjusted under 35 U.S.C. 154(b) by 42 days.

(21) Appl. No.: 16/809,425

(22) Filed: Mar. 4, 2020

(51) Int. Cl.
H04N 9/79 (2006.01)
H04W 48/20 (2009.01)
H04W 72/04 (2009.01)

(52) U.S. Cl.
CPC .......... *H04W 48/20* (2013.01); *H04N 9/7912* (2013.01); *H04W 72/0453* (2013.01); *H03D 2200/0088* (2013.01)

(58) Field of Classification Search
CPC ............. H04W 48/20; H04W 72/0453; H04W 72/082; H04W 72/0413; H04W 72/0426; H04W 88/08; H04W 92/10; H04N 9/7912; H03D 2200/0088
See application file for complete search history.

(56) References Cited

U.S. PATENT DOCUMENTS

| | | | |
|---|---|---|---|
| 9,002,404 | B1 | 4/2015 | Wurtenberger et al. |
| 9,143,303 | B1 | 9/2015 | Marupaduga |
| 9,369,161 | B1 | 6/2016 | Chukka et al. |
| 9,473,286 | B1 * | 10/2016 | Shipley ................... H04L 5/001 |
| 9,526,109 | B1 | 12/2016 | Wurtenberger et al. |
| 9,544,807 | B1 | 1/2017 | Marupaduga |
| 9,743,288 | B2 | 8/2017 | Grosspietsch et al. |
| 9,912,316 | B1 | 3/2018 | Somashekar et al. |
| 9,979,518 | B2 * | 5/2018 | Worrall ................. H04L 5/0094 |
| 10,555,211 | B1 | 2/2020 | Marupaduga et al. |

(Continued)

FOREIGN PATENT DOCUMENTS

| | | | |
|---|---|---|---|
| WO | 2019104541 A1 | 6/2019 | |
| WO | 2019148321 A1 | 8/2019 | |

*Primary Examiner* — Said M Elnoubi (57) ABSTRACT

A wireless communication network delivers multi-frequency service to User Equipment (UE). A primary node receives signaling from the UE that indicates secondary nodes along with their frequencies and signal strengths. The primary node selects candidate nodes based on the signal strengths for the secondary nodes. The primary node determines potential intermodulation interference between the primary frequency and the frequencies for the candidate set. The primary node selects a qualifying set from the candidate set based on the potential intermodulation interference. The primary node determines communication performance for the qualifying set and selects a serving set from the qualifying set based on the communication performance. The primary node wirelessly transfers signaling to the UE identifying the serving set and transfers signaling to the serving set identifying the UE. The serving set of secondary access nodes wirelessly transfer user data to the UE over their frequencies responsive to the signaling.

12 Claims, 7 Drawing Sheets

(56) References Cited

U.S. PATENT DOCUMENTS

| | | | |
|---|---|---|---|
| 2004/0025182 A1* | 2/2004 | Tari | H04W 72/085 |
| | | | 725/61 |
| 2017/0105154 A1* | 4/2017 | Li | H04W 36/0085 |
| 2017/0289889 A1* | 10/2017 | Sahu | H04L 5/0098 |
| 2018/0034597 A1* | 2/2018 | Uchino | H04L 1/1829 |
| 2019/0158137 A1 | 5/2019 | Brunel et al. | |
| 2019/0327779 A1 | 10/2019 | Lee et al. | |
| 2020/0084712 A1* | 3/2020 | Wu | H04B 7/0608 |

* cited by examiner

MULTI-FREQUENCY DATA COMMUNICATION SERVICE OVER MULTIPLE WIRELESS ACCESS NODES

TECHNICAL BACKGROUND

Wireless communication networks provide wireless data services to wireless user devices. The wireless data services include internet-access, media-streaming, machine communications, and the like. Exemplary wireless user devices comprise phones, computers, wearable transceivers, vehicles, robots, and sensors. The wireless communication networks have wireless access nodes that exchange wireless signals with the wireless user devices over radio frequencies using wireless network protocols. Exemplary wireless network protocols include Long Term Evolution (LTE) and Fifth Generation New Radio (5GNR).

The wireless access nodes are typically mounted on towers or some other elevated structures. Multiple wireless access nodes are often mounted on the same tower. To avoid interfering with one another, the wireless access nodes use different radio frequencies for their wireless communications with the wireless user devices. Some wireless user devices are configured to simultaneously communicate with multiple wireless access nodes over multiple radio frequencies. For example, a wireless user device may exchange wireless signals with an LTE access node over a primary frequency while also exchanging wireless signals with one or more 5GNR access nodes over secondary frequencies. In many network deployments, these wireless access nodes are mounted on the same tower and share some antenna circuitry. Thus, the shared antenna circuitry handles multiple frequencies at the same time.

The shared antenna circuitry may have non-linearities like rust that generate intermodulation interference when handling multiple radio frequencies. The intermodulation interference comprises Nyquist products which are the sums and differences of two radio frequencies that are modulating together in the same non-linearity of the shared antenna. The Nyquist products further comprise the multiples (×2, ×3, ×4 . . . ) of the sums and the differences that are called Nyquist orders. Unfortunately, the numerous Nyquist products interfere with legitimate radio frequencies that are used by other wireless access nodes on the same tower or on nearby towers. At present, the wireless access nodes do not efficiently and effectively mitigate the intermodulation interference that results from serving the wireless user devices over multiple radio frequencies from the same antenna at the same time.

TECHNICAL OVERVIEW

A wireless communication network delivers multi-frequency service to User Equipment (UE). A primary node receives signaling from the UE that indicates secondary nodes along with their frequencies and signal strengths. The primary node selects candidate nodes based on the signal strengths for the secondary nodes. The primary node determines potential intermodulation interference between the primary frequency and the frequencies for the candidate set. The primary node selects a qualifying set from the candidate set based on the potential intermodulation interference. The primary node determines communication performance for the qualifying set and selects a serving set from the qualifying set based on the communication performance. The primary node wirelessly transfers signaling to the UE identifying the serving set and transfers signaling to the serving set identifying the UE. The serving set of secondary access nodes wirelessly transfer user data to the UE over their frequencies responsive to the signaling.

DETAILED DESCRIPTION

Figure 1:
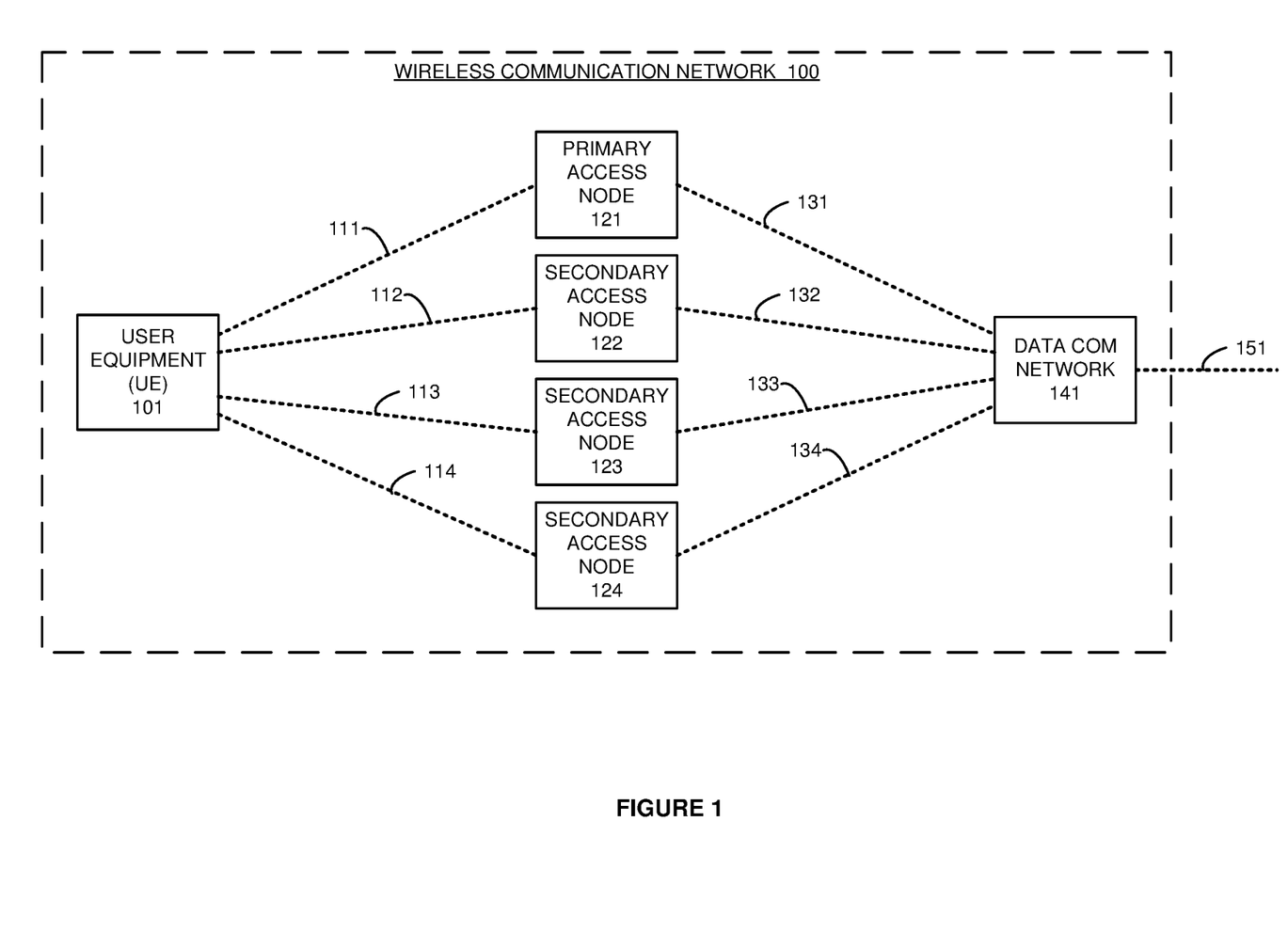
FIG. 1 illustrates a wireless communication network that serves User Equipment (UEs) with a multi-frequency data communication service over multiple wireless access nodes.

FIG. 1 illustrates wireless communication network 100 that serves User Equipment (UE) 101 with a multi-frequency data communication service over multiple wireless access nodes 121-124. Wireless communication network 100 supports wireless data services like internet-access, media-streaming, messaging, machine-control, machine-communications, and/or some other wireless data product. Wireless communication network 100 comprises UE 101, primary access node 121, secondary access nodes 122-124, and data com network 141.

UE 101 and primary access node 121 are coupled over primary frequency 111. UE 101 and secondary access node 122 are coupled over secondary frequency 112. UE 101 and secondary access node 123 are coupled over secondary frequency 113. UE 101 and secondary access node 124 are coupled over secondary frequency 114. Primary and secondary frequencies 111-114 reside in the low-band, mid-band, high-band, or some other part or the wireless electromagnetic spectrum. Primary and secondary frequencies 111-114 transport wireless network protocols like Fifth Generation New Radio, (5GNR), Long Term Evolution (LTE), Low-Power Wide Area Network (LP-WAN), Institute of Electrical and Electronic Engineers (IEEE) 802.11 (WIFI), or some other wireless networking technology.

Data com network 141 and access nodes 121-124 and are coupled over respective backhaul links 131-134. Data com network 141 communicates with external systems over data links 151. Backhaul links 131-134 and data links 151 use Time Division Multiplex (TDM), IEEE 802.3 (ETHERNET), Internet Protocol (IP), Data Over Cable System Interface Specification (DOCSIS), LTE, 5GNR, virtual switching, radio tunneling protocols, and/or some other data networking protocol.

UE 101 comprises radios and control circuitry which are coupled over bus circuitry. Primary and secondary access nodes 121-124 comprise radios and Baseband Units (BBUs) which are coupled over bus circuitry. The radios comprise antennas, filters, amplifiers, analog-to-digital interfaces, microprocessors, memory, software, transceivers, bus circuitry, and the like. The control circuitry, BBUs, and data com network 141 comprise microprocessors, memory, software, transceivers, bus circuitry, and the like. The microprocessors comprise Digital Signal Processors (DSP), Central Processing Units (CPUs), Graphical Processing Units (GPUs), Application-Specific Integrated Circuits (ASICs), and/or the like. The memories comprise Random Access Memory (RAM), flash circuitry, disk drives, and/or the like. The memories store software like operating systems, user applications, and network applications. The microprocessors read the software from the memories and execute the software to direct multi-frequency wireless communications over the radios.

Primary access node 121 may comprise an LTE access node like an eNodeB. Secondary access nodes 112-114 may comprise 5GNR access nodes like gNodeBs. Primary access node 121 and secondary access nodes 122-124 share an antenna or some other circuitry that has nonlinearities which generate intermodulation interference when handling primary and secondary frequencies 111-114.

UE 101 maintains a list of frequencies to scan when trying to use the wireless data communication service. When scanning primary frequency 111, UE 101 receives a wireless pilot signal from primary access node 121 over primary frequency 111. UE 101 processes the wireless pilot signal to determine signal strength, network Identifier (ID), and access node ID. When the signal strength is sufficient, UE 101 exchanges wireless signals with primary access node over primary frequency 111. Primary access node 121 typically interacts with data com network 141 over backhaul link 131 to authenticate and authorize UE 101 for the multi-frequency data communication service. Primary access node 121 may transfer neighbor information to UE 101 that indicates secondary frequencies 112-114. Secondary frequencies 112-114 may also be on the frequency list in UE 101.

When scanning secondary frequencies 112-114, UE 101 receives wireless pilot signals from secondary access node 122-124 over secondary frequencies 112-114. UE 101 processes the wireless pilot signals to determine signal strengths, network IDs, and access node IDs. UE 101 wirelessly transfers a report to primary access node 121 over primary frequency 111 that indicates the network IDs, access node IDs, secondary frequencies 112-114, and their signal strengths as detected by UE 101.

Primary access node 121 selects a candidate set of secondary access nodes 122-124 based on the signal strengths for secondary frequencies 112-114. For example, primary access node 121 may compare the signal strengths for secondary frequencies 112-114 to a candidate threshold to determine the candidate set. Primary access node then determines potential intermodulation interference between primary frequency 111 and the secondary frequencies used by the candidate set of secondary access nodes 122-124.

To determine the potential intermodulation interference, primary access node 121 determines Nyquist products for various combinations of primary frequency 121 and secondary frequencies 122-124. The combinations include the sums of primary frequency 111 and individual secondary frequencies 122-124. The combinations also include the differences from primary frequency 111 and individual secondary frequencies 112-114. Primary access node 121 then determines multiple orders of these sums and differences where the orders are the sums multiplied by 2, 3, 4 . . . and the differences multiplied by 2, 3, 4 . . . and so on. In some examples, primary access node 121 determines ten or more orders of the Nyquist products.

Primary access node 121 then determines spectral distances between the Nyquist products and primary frequency 111. The spectral distance is an amount of frequency. For example, the spectral distance between one megahertz and three megahertz is two megahertz. For three Nyquist orders for primary access node 121 and secondary access node 122, primary access node 122 determines the following spectral distances (D):

$D1$=(primary frequency 111+secondary frequency 122)−primary frequency 111;

$D2$=[2×(primary frequency 111+secondary frequency 122)]−primary frequency 111;

$D3$=[3×(primary frequency 111+secondary frequency 122)]−primary frequency 111;

$D4$=primary frequency 111−|primary frequency 111− secondary frequency 122|;

$D5$=[2×|primary frequency 111−secondary frequency 122|]−primary frequency 111; and $D6$=[3×|primary frequency 111−secondary frequency 122|]−primary frequency 111.

Primary access node 121 averages the spectral distances between the Nyquist products and primary frequency 111 for the secondary frequencies in the candidate set. For the three Nyquist orders above, the average spectral distance to primary frequency 111 from the Nyquist products of primary frequency 111 and secondary frequency 112 is:

Average spectral distance=$(D1+D2+D3+D4+D5+D6)/6$.

Primary access node 121 averages the spectral distances to primary frequency 111 from the Nyquist products of individual secondary frequencies 112-114 in the candidate set. Primary access node 111 selects a qualifying set of the candidate set of secondary access nodes 122-124 based on the potential intermodulation interference. In some examples, primary access node 111 selects a candidate access node for the qualifying set when the average spectral distance for its secondary frequency exceeds a qualifying threshold.

Primary access node 111 determines the current communication performance for the qualifying set of the candidate set of secondary access nodes 122-124. The communication performance could be average throughput, error rate, latency, or some other communication quality metric. Primary access node 111 selects a serving set of the qualifying set of the candidate set of secondary access nodes 112-114 based on their current communication performance. In some examples, primary access node 111 selects a qualifying access node for the serving set when its communication performance exceeds a serving threshold.

Primary access node 111 wirelessly transfers UE signaling to UE 101 that identifies the serving set of the secondary access nodes. Primary access node 111 transfers network signaling to the serving set of secondary access nodes to identify UE 101. Primary access node 111 wirelessly exchanges user data and network signaling with UE 101 over primary frequency 111. Primary access node 111 exchanges the user data and network signaling with data com network 141 over backhaul link 131. Data com network exchanges the user data with external systems over data links 151. UE 101 wirelessly attaches to the serving set of the secondary access nodes responsive to the signaling. Data come network 141 receives user data from external systems over data links 151. Data com network 141 transfers the user data to the serving set of secondary access nodes over their backhaul links. The serving set of secondary access nodes wirelessly transfer the user data to UE 101 over their secondary frequencies.

Figure 2:
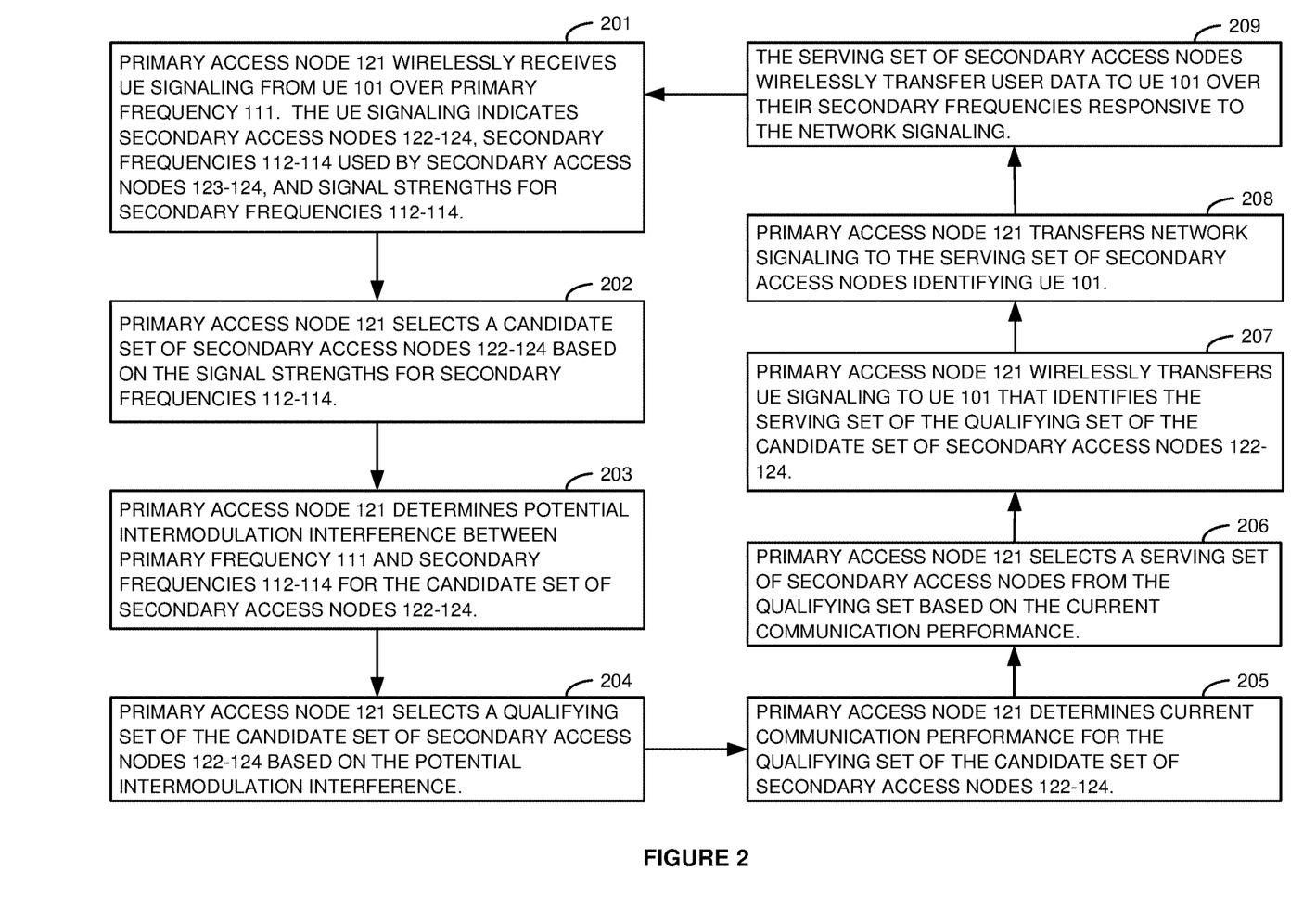
FIG. 2 illustrates the operation of the wireless communication network to serve the UEs with the multi-frequency data communication service over the multiple wireless access nodes.

FIG. 2 illustrates the operation of wireless communication network 100 to serve UE 101 with the multi-frequency data communication service over wireless access nodes 121-124. Primary access node 121 wirelessly receives signaling over primary frequency 111 that indicates secondary access nodes 122-124, their respective secondary frequencies 112-114, and their corresponding signal strengths at UE 101 (201). Primary access node 121 selects a candidate set of secondary access nodes 122-124 based on their signal strengths (202). For example, primary access node 121 may select all three secondary access nodes 122-124 for the candidate set when all access nodes 122-124 have good signal strength.

Primary access node 111 determines potential intermodulation interference between primary frequency 111 and secondary frequencies 112-114 in the candidate set of secondary access nodes 122-124 (203). Primary access node 111 selects a qualifying set of the candidate set of secondary access nodes 122-124 based on the potential intermodulation interference (204). For example, secondary access node 112 may not be selected for the qualifying set because its secondary frequency 112 has potential intermodulation interference with primary frequency 111.

Primary access node 111 determines the current communication performance for the qualifying set of the candidate set of secondary access nodes 122-124 (205). Primary access node 111 selects a serving set of the qualifying set of the candidate set of secondary access nodes 122-124 based on their current communication performance (206). For example, secondary access node 124 may be selected for the serving set because secondary access node 124 performs much better than secondary access node 123, and because secondary access node 122 has potential intermodulation interference issues. Primary access node 111 wirelessly transfers UE signaling to UE 101 that identifies the serving set of the qualifying set of the candidate set of secondary access nodes 122-124 (207). Primary access node 111 transfers network signaling to the serving set of secondary access nodes to identify UE 101 (208). The serving set of secondary access nodes wirelessly transfer user data to UE 101 over their secondary frequencies responsive to the network signaling (209).

Figure 3:
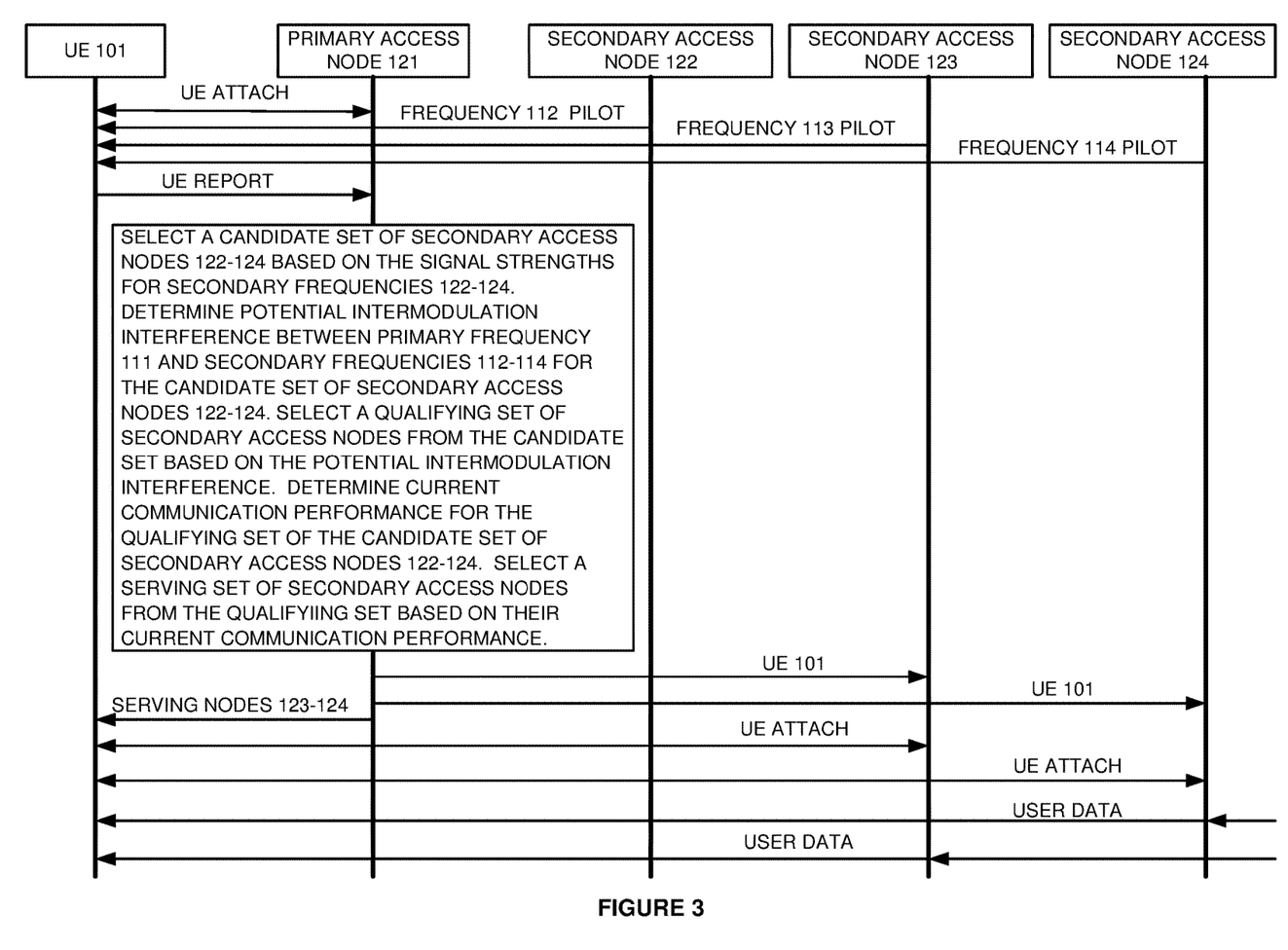
FIG. 3 illustrates the operation of the wireless communication network to serve the UEs with the multi-frequency data communication service over the multiple wireless access nodes.

FIG. 3 illustrates the operation of wireless communication network 100 to serve UE 101 with the multi-frequency data communication service over wireless access nodes 121-124. UE 101 wirelessly attaches to primary access node 121. UE 101 receives pilot signals over secondary frequencies 112-114 from secondary access nodes 122-124. UE 101 reports signal strength data for secondary frequencies 112-114 to primary access node 121. Primary access node 121 selects a candidate set of secondary access nodes 122-124 based on their signal strengths.

Primary access node 111 determines potential intermodulation interference between primary frequency 111 and the secondary frequencies in the candidate set of secondary access nodes 122-124. Primary access node 111 selects a qualifying set from the candidate set of secondary access nodes 122-124 based on the potential intermodulation interference. Primary access node 111 determines the current communication performance for the qualifying set of the candidate set of secondary access nodes 122-124. Primary access node 111 selects a serving set from the qualifying set of the candidate set of secondary access nodes 122-124 based on their current communication performance. In this example, primary access node 111 selects secondary access nodes 123-124 for the serving set because secondary access nodes 123-124 both perform well, and secondary access node 122 has potential intermodulation interference issues with primary frequency 111 used by primary access node 121.

Primary access node 111 wirelessly transfers UE signaling to UE 101 that identifies the serving set—secondary access nodes 123-124. Primary access node 111 transfers network signaling to serving secondary access nodes 123-124 to identify UE 101. Serving secondary access nodes 123-124 receive user data from data com network 141 and wirelessly transfer the user data to UE 101 over secondary frequencies 113-114. Advantageously, primary access node 121 efficiently and effectively mitigates the intermodulation interference that results from serving UE 101 over radio frequencies 111-114 from the same antenna at the same time.

Figure 4:
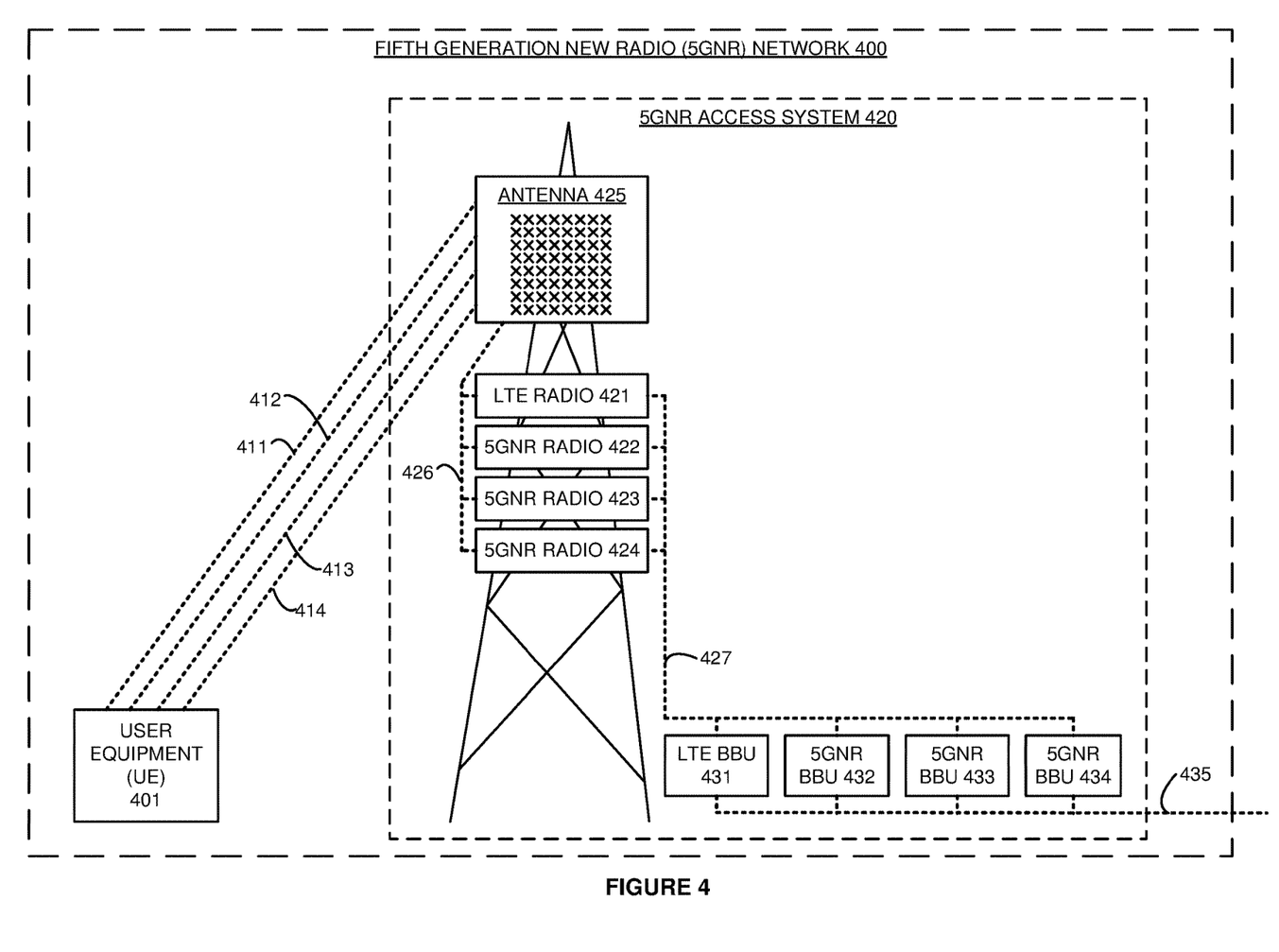
FIG. 4 illustrates a Fifth Generation New Radio (5GNR) network that serves a UE with a multi-frequency data communication service over a 5GNR access system.

FIG. 4 illustrates Fifth Generation New Radio (5GNR) network 400 that serves UE 401 with a multi-frequency data communication service over 5GNR access system 420. 5GNR network 400 is an example of wireless network 100, although network 100 may differ. 5GNR network 400 comprises 5GNR UE 401, radios 421-424, antenna 425, antenna links 426, fronthaul links 427, Baseband Units (BBUs) 431-434, and backhaul links 435. Radio 421 comprises a Long Term Evolution (LTE) radio. Radios 422-424 comprise 5GNR radios. BBU 431 comprises an LTE BBU. BBUs 432-434 comprise 5GNR BBUs.

An LTE access node like an eNodeB is formed by antenna 425, some of antenna links 426, LTE radio 421, some of fronthaul links 427, and LTE BBU 431. A 5GNR access node like a gNodeB is formed by antenna 425, some of antenna links 426, 5GNR radio 422, some of fronthaul links 427, and 5GNR BBU 432. Two more 5GNR access nodes are formed in a similar manner by antenna 425, antenna links 426, 5GNR radios 423-424, fronthaul links 427, and 5GNR BBUs 433-434.

Antenna 425 is wirelessly coupled to UE 401 over radio frequencies 411-414. Antenna 425 comprises amplifiers and antenna elements that are arranged in an 8×8 cross-pole grid. Antenna 425 is coupled to radios 421-424 over antenna links 426. Unfortunately, antenna 425 has nonlinearities like rust that generate intermodulation interference when handling radio frequencies 411-414.

Radios 421-424 comprise filters, modulation, analog-to-digital interfaces, DSP, and memory that are coupled over bus circuitry. Radios 421-424 are respectively coupled to BBUs 431-434 over fronthaul links 427. BBUs 431-434 comprise data Input/Output circuitry (I/O), CPU, memory, and memory. The memories store operating systems and network applications for Physical Layer (PHY), Media Access Control (MAC), Radio Link Control (RLC), Packet Data Convergence Protocol (PDCP), and Radio Resource Control (RRC). The CPU executes the operating system and network applications to exchange user data between UE 401 and backhaul links 435. Backhaul links 435 are coupled to other BBUs, Mobility Management Entities (MMEs), and Serving Gateways (SGWs).

UE 401 maintains a list of frequencies including radio frequency 411. UE 401 scans radio frequency 411 and identifies its pilot signal. UE 401 processes the pilot signal for radio frequency 411 and determines signal strength, network ID, and access node ID for LTE BBU 431. If the signal strength is sufficient, UE 401 wirelessly attaches to LTE BBU 431 over radio frequency 411, antenna 425, antenna links 426, LTE radio 431, and fronthaul links 427. LTE BBU 431 interacts with the MME over backhaul links 435 to authenticate and authorize UE 401 for the multi-frequency data communication service. LTE BBU 431 wirelessly transfers neighbor information to UE 401 that indicates radio frequencies 412-414.

In response to the neighbor information, UE 401 processes the pilot signals for radio frequencies 412-414 to determine signal strengths, network IDs, and access node IDs for 5GNR BBUs 432-434. UE 401 wirelessly reports the neighbor data to LTE BBU 431. LTE BBU 431 selects a candidate set of 5GNR BBUs 432-434 based on the signal strengths for their corresponding radio frequencies 412-414. LTE BBU 431 determines potential intermodulation interference between radio frequency 411 and radio frequencies 412-414 for the candidate set of 5GNR BBUs 432-434.

To determine the potential intermodulation interference, LTE BBU 431 determines Nyquist products for combinations of radio frequency 411 and individual radio frequencies 412-414. The combinations include the sums and the differences of radio frequency 411 and individual secondary frequencies 412-414. LTE BBU 431 determines multiple orders of the sums and the differences. LTE BBU 431 determines spectral distances between radio frequency 411 and the Nyquist products (the multiple orders of the sums and differences) for radio frequency 411 and individual radio frequencies 412-414. LTE BBU 431 averages the spectral distances for radio frequency 411 and individual radio frequencies 412-414.

LTE BBU 431 selects a qualifying set of the candidate set of 5GNR BBUs 432-434 based on the potential intermodulation interference of radio frequency 411 with individual radio frequencies 412-414. LTE BBU 431 the determines the current communication performance for the qualifying set of the candidate set of 5GNR BBUs 432-434. LTE BBU 431 then selects a serving set of the qualifying set of the candidate set of the 5GNR BBUs 432-434 based on their current communication performance.

LTE BBU 431 wirelessly transfers UE signaling to UE 401 that identifies the radio frequencies and IDs for the serving set of 5GNR BBUs. LTE BBU 431 transfers network signaling to the serving set of 5GNR BBUs to identify UE 401. LTE BBU 431 wirelessly exchanges user data and network signaling with UE 401 over radio frequency 411. LTE BBU 411 exchanges the user data and network signaling with an SGW and MME over backhaul links 435. UE 401 wirelessly attaches to the 5GNR BBUs in the serving set over their respective radio frequencies, antenna 425, antenna links 426, radios, and fronthaul links 427. LTE BBU 431 and the serving 5GNR BBU receive user data from the SGW over backhaul links 435. LTE BBU 431 and the serving 5GNR BBUs wirelessly transfer the user data to UE 401 over their respective radio frequencies, antenna 425, antenna links 426, radios, and fronthaul links 427.

Figure 5:
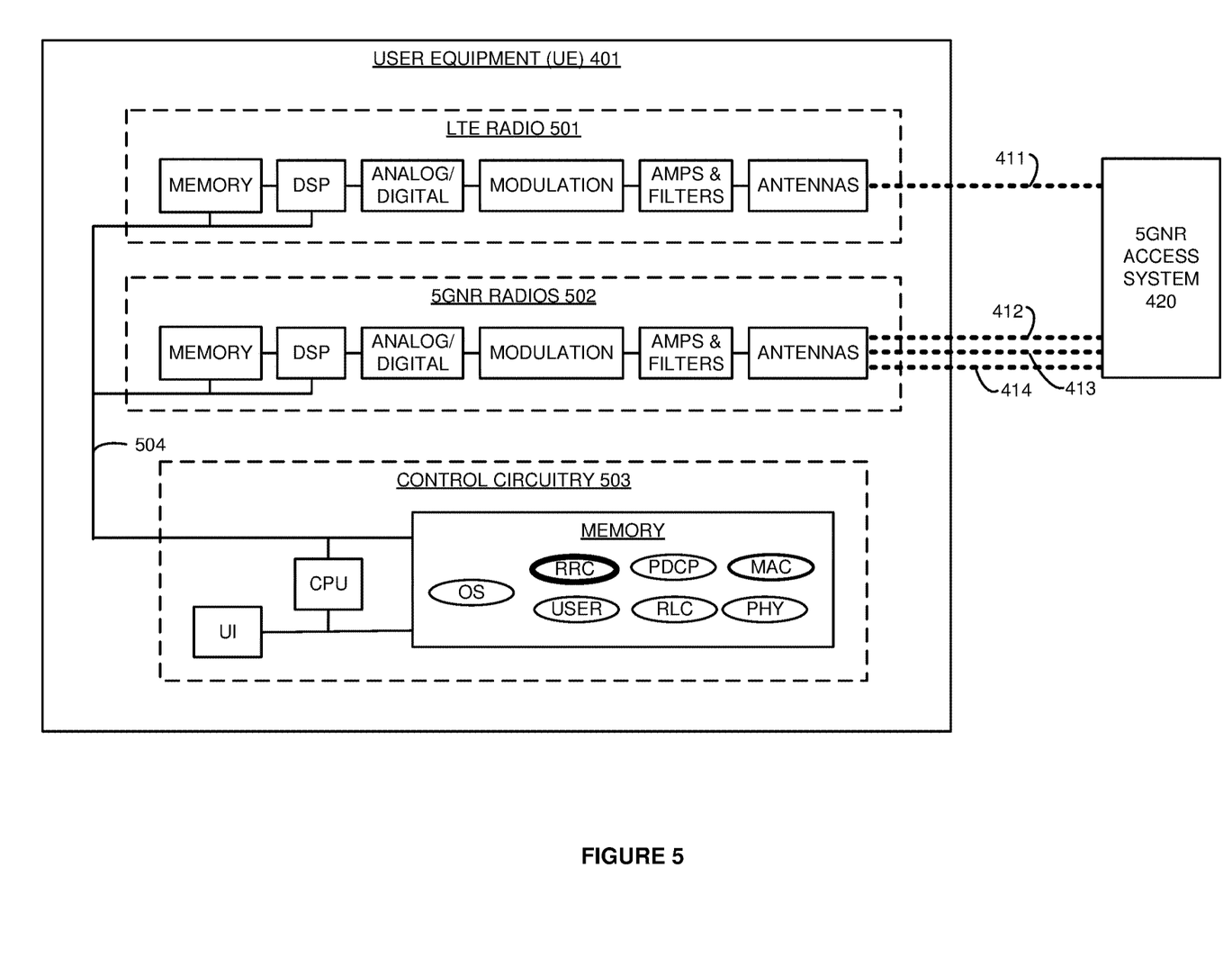
FIG. 5 illustrates the UE that receives the multi-frequency data communication service from the 5GNR access system.

FIG. 5 illustrates UE 401 that receives the multi-frequency data communication service from 5GNR access system 420. UE 401 is an example of UE 101, although UE 101 may differ. UE 401 comprises LTE radio 501, 5GNR radios 502, and control circuitry 503 that are coupled over bus circuitry 504. Radios 501-502 comprise antennas, amplifiers, filters, modulation, analog-to-digital interfaces, DSP, and memory that are coupled over bus circuitry. The antennas in UE 401 are wirelessly coupled to the shared antenna in 5GNR access system 420 over radio frequencies 411-414. Control circuitry 503 comprises user interfaces (UI), CPU, and memory. The memory in control circuitry 503 stores an operating system, user applications, and network applications for PHY, MAC, RLC, PDCP, and RRC. The CPU executes the operating system, user applications, and network applications to exchange signaling and data between the user applications and the network applications. The CPU executes the operating system and network applications to wirelessly exchange corresponding signaling and data with 5GNR access system 420 over radios 501-502 and radio frequencies 411-414.

In radios 501-502, the antennas receive wireless signals from 5GNR access system 420 over radio frequencies 411-412. The wireless signals transport Downlink (DL) LTE signaling, DL 5GNR signaling, DL LTE data, and DL 5GNR data. The antennas transfer corresponding electrical DL signals through duplexers to the amplifiers. The amplifiers boost the received DL signals for filters which attenuate unwanted energy. In modulation, demodulators down-convert the DL signals from radio frequencies 411-414. The analog/digital interfaces convert the analog DL signals into digital DL signals for the DSPs. The DSPs recover DL symbols from the DL digital signals. The CPU executes the network applications to process the DL symbols and recover the DL LTE signaling, DL 5GNR signaling, DL LTE data, and DL 5GNR data. The network applications transfer the DL data to the user applications over the operating system.

The network applications receive Uplink (UL) user signaling and data from the operating system for the user applications. The network applications process the UL user signaling, DL LTE signaling, and DL 5GNR signaling to generate new DL user signaling, UL LTE signaling, and UL 5GNR signaling. The network applications transfer new DL user signaling and data to the operating system for delivery to the user applications. The network applications process the new UL LTE signaling, UL 5GNR signaling, and UL LTE data to generate corresponding UL symbols. The DSPs process the UL symbols to generate corresponding digital signals for the analog-to-digital interfaces. The analog-to-digital interfaces convert the digital UL signals into analog UL signals for modulation. Modulation up-converts the UL signals to radio frequencies 411-414. The filters attenuate unwanted out-of-band energy and transfer the filtered UL signals through amplifiers to the antennas. The amplifiers boost the modulated UL signals to the selected UL transmit power levels. The electrical UL signals drive the antennas to emit corresponding wireless signals that transport the UL LTE signaling, UL LTE data, and UL 5GNR signaling to 5GNR access system 420 over radio frequencies 411-414.

RRC functions comprise authentication, security, handover control, status reporting, Quality-of-Service (QoS), network broadcasts and pages, and network selection. SDAP functions comprise QoS marking and flow control. PDCP functions comprise LTE/5GNR allocations, security ciphering, header compression and decompression, sequence numbering and re-sequencing, de-duplication. RLC functions comprise Automatic Repeat Request (ARQ), sequence numbering and resequencing, segmentation and resegmentation. MAC functions comprise buffer status, power control, channel quality, HARQ, user identification, random access, user scheduling, and QoS. PHY functions comprise packet formation/deformation, windowing/de-windowing, guard-insertion/guard-deletion, parsing/de-parsing, control insertion/removal, interleaving/de-interleaving, Forward Error Correction (FEC) encoding/decoding, rate matching/de-matching, scrambling/descrambling, modulation mapping/de-mapping, channel estimation/equalization, Fast Fourier Transforms (FFTs)/Inverse FFTs (IFFTs), channel coding/decoding, layer mapping/de-mapping, precoding, Discrete Fourier Transforms (DFTs)/Inverse DFTs (IDFTs), and Resource Element (RE) mapping/de-mapping.

In UE 401, the RRC maintains a list of frequencies including radio frequency 411. The RRC directs LTE radio 501 to scan radio frequency 411 and identify the pilot signal. LTE radio 501 performs the scan, and a PHY in control circuitry 503 processes pilot signal data for radio frequency 411 to determine signal strength, network ID, and access node ID for radio frequency 411. The PHY reports the signal strength and associated data to the RRC. When the signal strength is sufficient, the RRC wirelessly attaches LTE radio 501 to 5GNR access system 420 over radio frequency 411.

In response to wireless attachment, the RRC in UE 401 wirelessly receives neighbor information from 5GNR access system 420 that indicates radio frequencies 412-414. The RRC directs 5GNR radios 502 to scan radio frequencies 412-414 and identify the pilot signals. 5GNR radios 502 perform the scans, and the PHYs in control circuitry 503 process the pilot signal data to determine signal strengths, network IDs, and access node IDs for radio frequencies 412-414. The PHYs report the signal strengths and associated data to the RRC. The RRC wirelessly reports the signal strengths and IDs for radio frequencies 412-414 to 5GNR access system 420 over radio frequency 411.

The RRC in UE 401 receives LTE signaling from 5GNR access system 420 over radio frequency 411 that identifies a serving set of 5GNR access nodes including their IDs and radio frequencies. The network applications direct 5GNR radios 502 to wirelessly attach to the serving set of 5GNR access nodes using the specified IDs and radio frequencies. The network applications wirelessly receive DL 5GNR data over serving 5GNR radios 502 and their radio frequencies. The network applications transfer the DL data to the user applications over the operating system.

Figure 6:
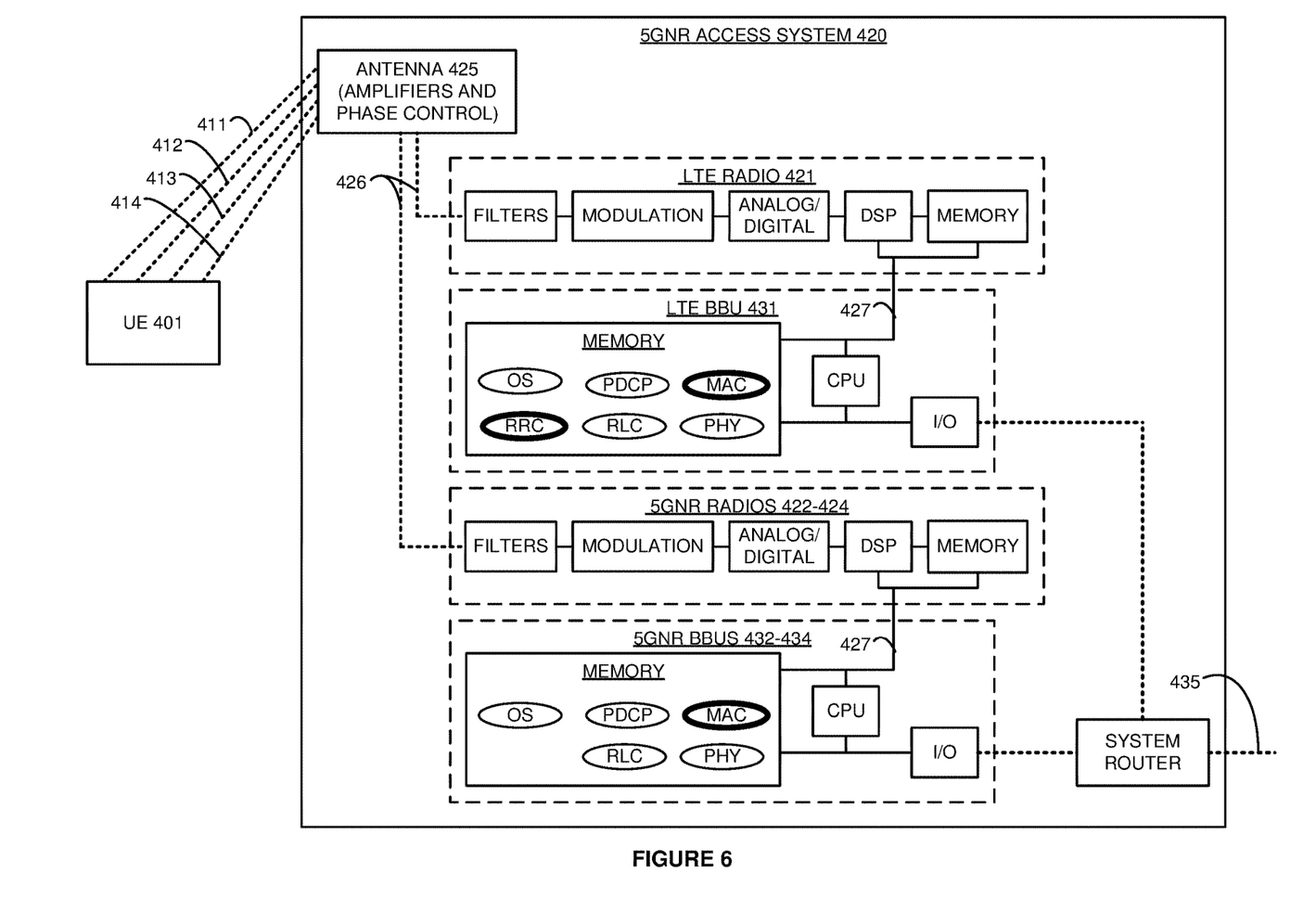
FIG. 6 illustrates the 5GNR access system that serves the UE with the multi-frequency data communication service.

FIG. 6 illustrates 5GNR access system 420 serves UE 401 with the multi-frequency data communication service. 5GNR access system 420 is an example of access nodes 121-124, although nodes 121-124 may differ. 5GNR access system 420 comprises LTE radio 421, 5GNR radios 422-424, antenna 425, antenna links 426, fronthaul links 427, LTE BBU 431, 5GNR BBUs 432-434, and a system router. An LTE access node comprises antenna 425, some of antenna links 426, LTE radio 421, some of fronthaul links 427, and LTE BBU 431. The 5GNR access nodes comprise antenna 425, some of antenna links 426, 5GNR radios 422-424, some of fronthaul links 427, and 5GNR BBUs 432-434.

UE 401 is wirelessly coupled to antenna 425 over radio frequencies 411-414. Antenna 425 includes amplifiers and phase control per cross-pole antenna element. Radios 421-424 comprise filters, modulation, analog-to-digital interfaces, DSP, and memory that are coupled over bus circuitry. Fronthaul links 427 comprise Common Public Radio Interface (CPRI) links. BBUs 431-434 comprise memory, CPU, and data Input/Output (I/O) that are coupled over bus circuitry. The data I/Os are coupled to the system router which is coupled to backhaul links 435. In BBUs 431-434, the memories store operating systems, PHYs, MACs, RLCs, PDCPs, and an RRC. The CPUs in BBUs 431-434 execute the PHYs, MACs, RLCs, PDCPs, and RRC to drive the exchange of data and signaling between UE 401 and backhaul links 435 over radios 421-424. Unfortunately, antenna 425 has nonlinearities like rust that generate intermodulation interference when handling radio frequencies 411-414.

Antenna 425 receives wireless signals from UE 401 over radio frequencies 411-414 that transport UL LTE signaling, UL 5GNR signaling, and UL LTE data. Antennas 425 transfer corresponding electrical UL signals through duplexers and amplifiers that boost the received UL signals. The filters attenuate unwanted energy. Demodulators down-convert the UL signals from radio frequencies 411-414. The analog/digital interfaces convert the analog UL signals into digital UL signals for the DSP. The DSP recovers UL symbols from the UL digital signals. The DSPs transfer the UL symbols to BBUs 431-434 over fronthaul links 427. In BBUs 431-434, the CPUs execute the network applications to process the UL symbols and recover the UL LTE data, UL 5GNR signaling, and UL LTE data. The PHYs determine signal strengths for the UL and data.

The network applications process the UL LTE signaling, UL 5GNR signaling, and DL LTE signaling to generate new UL LTE signaling, DL LTE signaling, and DL 5GNR signaling. The network applications transfer the new UL LTE signaling to the MME over the data I/O, router, and backhaul links 435. The LTE PDCP transfers the UL LTE data to the SGW over the data I/O, router, and backhaul links 435.

The network applications receive DL LTE signaling from the MME over the data I/O and backhaul links 435. The network applications receive DL LTE data and DL 5GNR data from the SGW over the data I/O and backhaul links 435. The network applications process the DL LTE signaling, DL LTE data, and DL 5GNR data to generate corresponding DL symbols in the frequency domain. The network applications transfer the DL symbols to radios 421-424 over fronthaul links 427. In 5GNR access system 420, the PDCPs determine average DL throughput for radio frequencies 411-414 and report the average DL throughputs to the RRC.

In radios 421-424, the DSPs process the DL symbols to generate corresponding digital signals for the analog-to-digital interfaces. The analog-to-digital interfaces convert the digital DL signals into analog DL signals for modulation. Modulation up-converts the DL signals to radio frequencies 411-414. The filters attenuate unwanted out-of-band energy and transfer the filtered DL signals through duplexers to amplifiers in antenna 425 which boost the filtered DL signals. The electrical DL signals drive antenna 425 to emit corresponding wireless signals that transport the DL LTE signaling, DL 5GNR signaling, DL LTE data, and DL 5GNR data to UE 401 over radio frequencies 411-414.

RRC functions comprise authentication, security, handover control, status reporting, QoS, network broadcasts and pages, and network selection. PDCP functions comprise LTE/5GNR allocations, security ciphering, header compression and decompression, sequence numbering and re-sequencing, de-duplication. RLC functions comprise ARQ, sequence numbering and resequencing, segmentation and resegmentation. MAC functions comprise buffer status, power control, channel quality, HARQ, user identification, random access, user scheduling, and QoS. PHY functions comprise packet formation/deformation, windowing/de-windowing, guard-insertion/guard-deletion, parsing/de-parsing, control insertion/removal, interleaving/de-interleaving, FEC encoding/decoding, rate matching/de-matching, scrambling/descrambling, modulation mapping/de-mapping, channel estimation/equalization, FFTs/IFFTs, channel coding/decoding, layer mapping/de-mapping, precoding, DFTs/IDFTs, and RE mapping/de-mapping.

LTE BBUs 431-434 wirelessly broadcast their network and system IDs over radios 421-424 and antenna 425. LTE BBU 431 wirelessly receives attachment signaling from UE 401 over radio frequency 411, antenna 425, antenna links 426, LTE radio 431, and fronthaul links 427. LTE BBU 431 interacts with the MME over backhaul links 435 to authenticate and authorize UE 401 for the multi-frequency data communication service. LTE BBU 431 wirelessly transfers neighbor information to UE 401 that indicates radio frequencies 412-414. LTE BBU 431 receives reports from UE 401 that indicate signal strengths and IDs for radio frequencies 412-414.

LTE BBU 431 selects a candidate set of 5GNR BBUs 432-434 based on the signal strengths for their corresponding radio frequencies 412-414. LTE BBU 431 determines potential intermodulation interference between radio frequency 411 and radio frequencies 412-414 for the candidate set of 5GNR BBUs 432-434. LTE BBU 431 selects a qualifying set of the candidate 5GNR BBUs based on the potential intermodulation interference of radio frequency 411 with individual radio frequencies 412-414 in the candidate set. LTE BBU 431 determines the current communication performance for the qualifying 5GNR BBUs. LTE BBU 431 then selects a serving set of the qualifying 5GNR BBUs based on their current communication performance.

LTE BBU 431 wirelessly transfers UE signaling over LTE radio 421 to UE 401 that identifies the radio frequencies and IDs for the serving 5GNR BBUs. LTE BBU 431 transfers network signaling that identifies UE 401 over backhaul links 435 to the serving 5GNR BBUs. LTE BBU 431 wirelessly exchanges user data and network signaling with UE 401 over radio 421 and radio frequency 411. LTE BBU 411 exchanges the user data and network signaling with the SGW and MME over backhaul links 435. UE 401 wirelessly attaches to the serving 5GNR BBUs over their respective radio frequencies, antenna 425, antenna links 426, radios, and fronthaul links 427. LTE BBU 431 and the serving 5GNR BBUs receive user data from the SGW over backhaul links 435. LTE BBU 431 and the serving 5GNR BBUs wirelessly transfer the user data to UE 401 over their respective fronthaul links 427, radios, antenna links 426, antenna 425, and radio frequencies.

Figure 7:
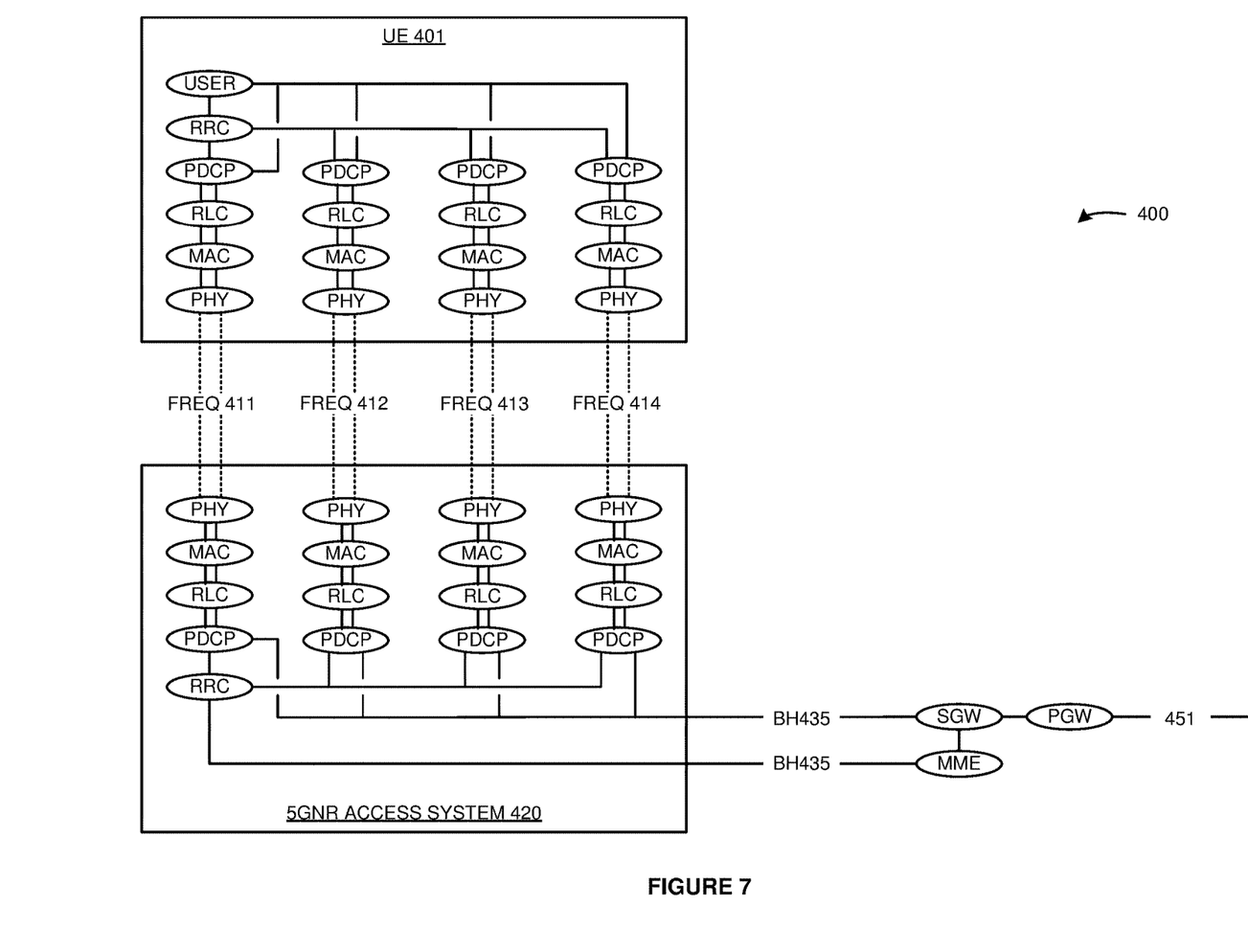
FIG. 7 illustrates the operation of the 5GNR network to serve the UE with the multi-frequency data communication service over the 5GNR access system.

FIG. 7 illustrates the operation of 5GNR network 400 to serve UE 401 with the multi-frequency data communication service over 5GNR access system 420. The RRC in UE 401 directs a scan of radio frequency 411 to identify its pilot signal. The PHY processes pilot signal data for radio frequency 411 to determine signal strength, network ID, and system ID for radio frequency 411. The PHY reports the signal strength and associated data to the RRC. When the signal strength is sufficient, the RRC wirelessly attaches to the RRC in 5GNR access system 420 over radio frequency 411 and their PDCPs, RLCs, MACs, and PHYs.

The RRC in 5GNR access system 420 transfers signaling to the MME over backhaul links (BH) 435 to authenticate and authorize UE 401 for the multi-frequency wireless data service. When authorized, the RRC in 5GNR access system 420 transfers signaling to UE 401 indicating radio frequencies 412-414. The RRC in UE directs the scan of radio frequencies 412-414 to identify their pilot signals. The PHYs process pilot signal data for radio frequencies 412-414 to determine signal strengths, network IDs, and access node IDs. The PHYs report the signal strengths and associated data to the RRC. The RRC in UE 401 wirelessly reports the signal strengths and associated data for radio frequencies 412-414 to the RRC in 5GNR access system 420 over radio frequency 411 and their PDCPs, RLCs, MACs, and PHYs.

The RRC in 5GNR access system 420 receives the report from UE 401 and selects a candidate set of 5GNR access nodes based on the signal strengths for corresponding radio frequencies 412-414. The RRC determines potential intermodulation interference between radio frequency 411 and radio frequencies 412-414 for the candidate 5GNR access nodes. To determine the potential intermodulation interference, the RRC determines the sums and differences for radio frequency 411 and individual radio frequencies 412-414. The RRC then determines 25 orders of the sums and the differences. The RRC determines spectral distances between the radio frequency 411 and the individual orders of the sums and the differences for individual radio frequencies 412-414. The RRC averages the spectral distances for radio frequency 412. The RRC averages the spectral distances for radio frequency 413. The RRC averages the spectral distances for radio frequency 414.

The RRC selects qualifying 5GNR access nodes from the candidate 5GNR access nodes based on the potential intermodulation interference with radio frequency 411. For example, the RRC selects qualifying 5GNR access nodes that have average spectral distances above a qualifying threshold. The RRC determines the current communication performance for the qualifying 5GNR access nodes. The PDCPs determine and report average throughput for their radio frequencies to the RRC. The RRC selects serving 5GNR access nodes from the qualifying 5GNR access nodes based on their current communication performance. For example, the RRC may select the qualifying 5GNR access nodes that have average DL throughput that exceeds a serving throughput threshold. The RRC in 5GNR access system 420 wirelessly transfers signaling to the RRC in UE 401 that identifies the serving radio frequencies and associated data over radio frequency 411 and their PDCPs, RLCs, MACs, and PHYs. The RRC in 5GNR access system 420 transfers network signaling that identifies UE 401 over backhaul links 435 to the serving 5GNR access nodes.

The RRC in UE 401 directs the serving 5GNR PDCPs to in UE 401 to wirelessly attach to the serving 5GNR PDCPs in 5GNR access system 420 over the selected radio frequencies. The serving PDCPs in 5GNR access system 420 report the attachments to the RRC, and the RRC exchanges network signaling with MME over backhaul links 435 responsive to the attachments. The MME directs the SGW and PGW to serve UE 401 over the serving 5GNR access nodes. The PGW receives data for UE 401 from data links 451 and transfers the data to the SGW. The LTE PDCP and the serving 5GNR PDCPs in 5GNR access system 420 receive user data from the SGW over backhaul links 435. The LTE PDCP and the serving 5GNR PDCPs wirelessly transfer the user data to UE 401 over the serving ones of radio frequencies 411-414 and their RLCs, MACs, and PHYs. The PDCPs in UE 401 deliver the DL data to the user applications over the operating system.

The wireless data network circuitry described above comprises computer hardware and software that form special-purpose network circuitry to serve UEs with multi-frequency data communication service over multiple wireless access nodes. The computer hardware comprises processing circuitry like CPUs, DSPs, GPUs, transceivers, bus circuitry, and memory. To form these computer hardware structures, semiconductors like silicon or germanium are positively and negatively doped to form transistors. The doping comprises ions like boron or phosphorus that are embedded within the semiconductor material. The transistors and other electronic structures like capacitors and resistors are arranged and metallically connected within the semiconductor to form devices like logic circuitry and storage registers. The logic circuitry and storage registers are arranged to form larger structures like control units, logic units, and Random-Access Memory (RAM). In turn, the control units, logic units, and RAM are metallically connected to form CPUs, DSPs, GPUs, transceivers, bus circuitry, and memory.

In the computer hardware, the control units drive data between the RAM and the logic units, and the logic units operate on the data. The control units also drive interactions with external memory like flash drives, disk drives, and the like. The computer hardware executes machine-level software to control and move data by driving machine-level inputs like voltages and currents to the control units, logic units, and RAM. The machine-level software is typically compiled from higher-level software programs. The higher-level software programs comprise operating systems, utilities, user applications, and the like. Both the higher-level software programs and their compiled machine-level software are stored in memory and retrieved for compilation and execution. On power-up, the computer hardware automatically executes physically-embedded machine-level software that drives the compilation and execution of the other computer software components which then assert control. Due to this automated execution, the presence of the higher-level software in memory physically changes the structure of the computer hardware machines into special-purpose network circuitry to serve UEs with multi-frequency data communication service over multiple wireless access nodes.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. Thus, the invention is not limited to the specific embodiments described above, but only by the following claims and their equivalents.

What is claimed is:

1. A method of operating a wireless communication network to deliver multi-frequency communication service to a wireless User Equipment (UE), the method comprising:
   a primary access node wirelessly receiving UE signaling from the UE over a primary frequency that indicates secondary access nodes, secondary frequencies used by the secondary access nodes, and signal strengths for the secondary frequencies;
   the primary access node selecting a candidate set of the secondary access nodes based on the signal strengths for the secondary frequencies;
   the primary access node determining potential intermodulation interference between the primary frequency and the secondary frequencies for the candidate set of the secondary access nodes and selecting a qualifying set of the secondary access nodes from the candidate set based on the potential intermodulation interference, wherein determining the potential intermodulation interference comprises determining Nyquist products for combinations of the primary frequency and the secondary frequencies and for multiple orders of the combinations of the primary frequency and the secondary frequencies, determining spectral distances between the Nyquist products and the primary frequency, and averaging the spectral distances between the primary frequency and the multiple orders of the combinations of the primary frequency and the secondary frequencies;
   the primary access node determining current communication performance for the qualifying set of the secondary access nodes and selecting a serving set of the secondary access nodes from the qualifying set based on the current communication performance;
   the primary access node wirelessly transferring additional UE signaling to the UE identifying the serving set of the secondary access nodes and transferring network signaling to the serving set of the secondary access nodes identifying the UE; and
   the serving set of the secondary access nodes wirelessly transferring user data to the UE over their ones of the secondary frequencies responsive to the network signaling.

2. The method of claim 1 wherein the primary access node and the secondary access nodes share an antenna.

3. The method of claim 1 wherein the combinations of the primary frequency and the secondary frequencies comprise sums of the primary frequency and the secondary frequencies and differences of the primary frequency and the secondary frequencies.

4. The method of claim 1 wherein the multiple orders of the combinations of the primary frequency and the secondary frequencies comprises ten or more orders.

5. The method of claim 1 wherein the primary access node selecting the qualifying set of the secondary access nodes based on the potential intermodulation interference comprises selecting the qualifying set of the secondary access nodes from the candidate set based on the average spectral distances of the Nyquist products for the secondary access nodes to the primary frequency.

6. The method of claim 1 wherein the secondary access nodes comprise Fifth Generation New Radio (5GNR) access nodes.

7. A wireless communication network to deliver multi-frequency communication service to a wireless User Equipment (UE), the wireless communication network comprising:
   a primary access node configured to wirelessly receive UE signaling from the UE over a primary frequency that indicates secondary access nodes, secondary frequencies used by the secondary access nodes, and signal strengths for the secondary frequencies;
   the primary access node configured to select a candidate set of the secondary access nodes based on the signal strengths for the secondary frequencies;
   the primary access node configured to determine potential intermodulation interference between the primary frequency and the secondary frequencies for the candidate set of the secondary access nodes and select a qualifying set of the secondary access nodes from the candidate set based on the potential intermodulation interference, wherein determining the potential intermodulation interference comprises determining Nyquist products for combinations of the primary frequency and the secondary frequencies and for multiple orders of the combinations of the primary frequency and the secondary frequencies, determining spectral distances between the Nyquist products and the primary frequency, and averaging the spectral distances between the primary frequency and the multiple orders of the combinations of the primary frequency and the secondary frequencies;
   the primary access node configured to determine current communication performance for the qualifying set of the secondary access nodes and select a serving set of the secondary access nodes from the qualifying set based on the current communication performance;
   the primary access node configured to wirelessly transfer additional UE signaling to the UE identifying the serving set of the secondary access nodes and transfer network signaling to the serving set of the secondary access nodes identifying the UE; and the serving set of the secondary access nodes configured to wirelessly transfer user data to the UE over their ones of the secondary frequencies responsive to the network signaling.

8. The wireless communication network of claim 7 wherein the primary access node and the secondary access nodes are configured to share an antenna.

9. The wireless communication network of claim 7 wherein the combinations of the primary frequency and the secondary frequencies comprise sums of the primary frequency and the secondary frequencies and differences of the primary frequency and the secondary frequencies.

10. The wireless communication network of claim 7 wherein the multiple orders of the combinations of the primary frequency and the secondary frequencies comprises ten or more orders.

11. The wireless communication network of claim 7 wherein the primary access node is configured to select the qualifying set of the secondary access nodes from the candidate set based on the average spectral distances of the Nyquist products for the secondary access nodes to the primary frequency.

12. The wireless communication network of claim 7 wherein the secondary access nodes comprise Fifth Generation New Radio (5GNR) access nodes.

* * * * *